(12) United States Patent
Stiens et al.

(10) Patent No.: US 9,238,267 B2
(45) Date of Patent: Jan. 19, 2016

(54) CUTTING INSERT AND METHOD FOR PRODUCTION THEREOF

(71) Applicant: Walter AG, Tubingen (DE)

(72) Inventors: Dirk Stiens, Reutlingen (DE); Sakari Ruppi, Tubingen (DE); Thomas Fuhrmann, Rothenbach (DE)

(73) Assignee: Walter AG, Tübingen (DE)

( * ) Notice: Subject to any disclaimer, the term of this patent is extended or adjusted under 35 U.S.C. 154(b) by 0 days.

(21) Appl. No.: 14/240,146

(22) PCT Filed: Sep. 17, 2012

(86) PCT No.: PCT/EP2012/068204
§ 371 (c)(1),
(2) Date: Feb. 21, 2014

(87) PCT Pub. No.: WO2013/037997
PCT Pub. Date: Mar. 21, 2013

(65) Prior Publication Data
US 2014/0193624 A1    Jul. 10, 2014

(30) Foreign Application Priority Data

Sep. 16, 2011   (DE) .......................... 10 2011 053 705

(51) Int. Cl.
*C23C 16/40*   (2006.01)
*B23B 27/14*   (2006.01)
(Continued)

(52) U.S. Cl.
CPC .................. *B23B 27/148* (2013.01); *B23C 5/20* (2013.01); *C23C 16/403* (2013.01); *C23C 16/56* (2013.01);
(Continued)

(58) Field of Classification Search
USPC ............ 51/307, 309; 428/216, 336, 472, 697, 428/698, 699, 701, 702, 704
See application file for complete search history.

(56) References Cited

U.S. PATENT DOCUMENTS 5,374,471 A * 12/1994 Yoshimura et al. ............. 51/309
5,654,035 A *  8/1997 Ljungberg et al. ....... 427/255.34
(Continued)

FOREIGN PATENT DOCUMENTS

CN        1939715        4/2007
CN       101274493      10/2008
(Continued)

OTHER PUBLICATIONS

International Preliminary Report on Patentability dated Mar. 27, 2014, for International Application No. PCT/ EP2012/068204.
(Continued)

*Primary Examiner* — Archene Turner
(74) *Attorney, Agent, or Firm* — Morgan, Lewis & Bockius LLP

(57) ABSTRACT

Cutting insert made of hard metal, cermet or ceramic substrate body with multi-layer coating applied thereto by CVD methods. The coating has a total thickness of 5 to 40 μm and, starting from the substrate surface, has one or more hard material layers, an alpha aluminum oxide ($\alpha$-$Al_2O_3$) layer of a layer thickness of 1 to 20 μm and optionally at least portionwise over the $\alpha$-$Al_2O_3$ layer one or more further hard material layers as decorative or wear recognition layers. The $\alpha$-$Al_2O_3$ layer has a crystallographic preferential orientation characterized by a texture coefficient TC (0 0 12)≥5 for the (0 0 12) growth direction.
The $\alpha$-$Al_2O_3$ layer has an inherent stress in the region of 0 to +300 MPas, and the substrate within a region of 0 to 10 μm from the substrate surface has an inherent stress minimum in the region of −2000 to −400 MPas.

23 Claims, 1 Drawing Sheet

(Invention)

(51) Int. Cl.
  C23C 16/56    (2006.01)
  C23C 28/04    (2006.01)
  C23C 30/00    (2006.01)
  B23C 5/20     (2006.01)
  C30B 25/00    (2006.01)
(52) U.S. Cl.
  CPC ............ *C23C 28/044* (2013.01); *C23C 30/005* (2013.01); *C30B 25/00* (2013.01); *Y10T 428/24975* (2015.01)

(56) References Cited

U.S. PATENT DOCUMENTS

| | | | |
|---|---|---|---|
| 5,863,640 | A * | 1/1999 | Ljungberg et al. ............ 428/701 |
| 6,350,510 | B1 | 2/2002 | Konig et al. |
| 6,756,111 | B1 * | 6/2004 | Okada et al. ................... 428/702 |
| 6,884,496 | B2 * | 4/2005 | Westphal et al. ............. 428/698 |
| 7,135,221 | B2 * | 11/2006 | Ruppi et al. ................... 428/698 |
| 7,163,735 | B2 * | 1/2007 | Ruppi ............................... 51/307 |
| 2003/0104254 | A1 | 6/2003 | Westphal et al. |
| 2007/0104945 | A1 | 5/2007 | Ruppi |
| 2008/0187774 | A1 | 8/2008 | Ruppi |
| 2011/0045283 | A1 | 2/2011 | Holzschuh et al. |
| 2012/0015148 | A1 | 1/2012 | Ruppi |

FOREIGN PATENT DOCUMENTS

| | | |
|---|---|---|
| DE | 197 19 195 | 11/1998 |
| DE | 101 23 554 | 10/2002 |
| DE | 10 2008 009 487 | 8/2009 |
| EP | 0 600 115 | 6/1994 |
| EP | 1 138 800 | 10/2001 |
| EP | 1 806 192 | 7/2007 |
| EP | 1 825 943 | 8/2007 |
| EP | 1 905 870 | 4/2008 |
| EP | 1 953 258 | 8/2008 |
| EP | 2 014 789 | 1/2009 |
| JP | 64-031972 | 2/1989 |
| JP | 6-173014 | 6/1994 |
| WO | 02/077312 | 10/2002 |
| WO | 2009/034036 | 3/2009 |
| WO | 2009/101025 | 8/2009 |

OTHER PUBLICATIONS

M.v.Laue et al., Lorentz-Faktor und Intensitatsverteilung in Debye-Scherre-Ringen, Zeitschrift Fur Kristallogrhapie, 64, pp. 115-142, 1926.

Macherauch et al., Das Sint Verfahren der Rontgenographischen Spannungsmessung, Zeitschrif Fur Angewandte Physik 13, pp. 305-312, 1961.

Genzel, X-Ray Residual Stress Analysis in Thin Films Under Grazing Incidence-Basic Aspects and Applications, Materials Science and Technology, 21:1, pp. 10-18, 2005.

Ruppersbert et al., Evaluation of Strongly Non-Linear Surface-Stress Fields sigmaxx(z) and sigmayy(z) from Diffraction Experiments, Physics Status Solidi (a), 116, pp. 681-687, 1989.

Genzel et al., A Self-Consistent Method for X-Ray Diffraction Analysis of Multiaxial Residual-Stress Fields in the NearSurface Region of Polycrystalline Materials. II. Examples, Journal of Applied Crystallography, 32, pp. 779-787, 1999.

Genzel et al., Residual Stress Fields in Surface-Treated Silicon Carbide for Space Industry-Comparison of Biaxial and Triaxial Analysis Using Different X-Ray Methods, Materials science and Engineering A, 390, pp. 376-384, 2005.

Genzel, X-Ray Stress Analysis in Presence of Gradients and Texture, Advances in X-Ray Analysis, 44, pp. 247-256, 2001.

Genzel, et al., Application of Energy-Dispersive Diffraction to the Analysis of Multiaxial Residual Stress Fields in the Intermediate Zone Between Surface and Volume, Materials Science and Engineering A, 372, pp. 28-43, 2004.

Genzel et al., The Materials Science Beamline EDDI for Energy-Dispersive Analysis of Subsurface Residual Stress Gradients, Materials Science Forum, 524-525, pp. 193-198, 2006.

Kress et al., Phonon Anomalies in Transition-Metal Nitrides: TiN, Physical Review B, 17:1, pp. 111-113, 1978.

Eshelby, The Determination of the Elastic Field of an Ellipsoidal Inclusion, and Related Problems, Proceedings of the Royal Society of London, 241, pp. 376-396, 1957.

Kroner, Berechnung der Elastischen Konstanten des Vielkristalls aus den Konstanten des Einkristalls, Zeitschrift Fur Physik, 151, pp. 504-518, 1958.

Eigenmann et al., Rontgenographische Untersuchung von Spannungszustanden in Werkstoffen, Materialwissenschaft und Werkstofftechnik, 27:9, pp. 426-437, 1996.

Hauk, Structural and Residual Stress Analysis by Nondestructive Methods, Chapters 1, 2 and 6, Elsevier, 305 pages, 1997.

Genzel, Diffraction Analysis of the Micro-Structure of Materials, Article 18, Problems Related to X-Ray Stress Analysis in in Thin Films in the Presence of Gradients and Texture, Springer Series in Material Science, 68, pp. 475-505, 2004.

Stock, Analyse Mehrachsiger Eigenspannungsverteilungen im Intermediaren Werkstoffbereich Zwischen Oberliache und Volmen Mittels Energiedispersiver Rontgenbeugung, Doctoral Thesis, TU Berlin, 125 pages, 2003.

German Search Report in Application No. 10 2011 053 705.8 dated May 15, 2012.

International Search Report and Written Opinion in PCT/EP2012/068204 dated Dec. 18, 2012.

Landoldt-Bornstein, "Numerical Data and Functional Relationships in Science and Technology," New Series, Group III, vol. 11, Springer, Berlin, 1979, 10 pages (including pp. 1 and 50-51).

Office Action (with English Translation) for Chinese Application No. 201280044979.1 dated Jun. 3, 2015.

* cited by examiner (State of the art)

(Invention)

CUTTING INSERT AND METHOD FOR PRODUCTION THEREOF

SUBJECT OF THE INVENTION

The invention concerns a coated cutting insert made of a hard metal, cermet or ceramic substrate body and a multi-layer coating which is applied thereto by means of CVD methods and which starting from the substrate surface has one or more hard material layers, over the hard material layers an alpha aluminium oxide ($\alpha$-$Al_2O_3$) layer and optionally at least portion-wise over the $\alpha$-$Al_2O_3$ layer one or more further hard material layers as decorative or wear recognition layers.

BACKGROUND OF THE INVENTION

Cutting inserts for material working, in particular for cutting metal working, comprise a hard metal, cermet or ceramic substrate body which in most cases is provided with a single-layer or multi-layer surface coating to improve the cutting and/or wear properties. The surface coatings comprise mutually superposed hard material layers of carbides, nitrides, oxides, carbonitrides, oxynitrides, oxycarbides, oxycarbonitrides, borides, boronitrides, borocarbides, borocarbonitrides, borooxynitrides, borooxocarbides or borooxocarbonitrides of the elements of groups IVa to VIIa of the periodic system and/or aluminium, mixed metal phases and phase mixtures of the afore-mentioned compounds. Examples of the afore-mentioned compounds are TiN, TiC, TiCN and $Al_2O_3$. An example of a mixed metal phase in which in a crystal a metal is partially replaced by another is TiAlN. Coatings of the afore-mentioned kind are applied by CVD methods (chemical vapour phase deposition), PCVD methods (plasma-supported CVD methods) or by PVD methods (physical vapour phase deposition).

Inherent stresses obtain in almost every material as a consequence of mechanical, thermal and/or chemical treatment. In the production of cutting inserts by coating a substrate body by means CVD methods, inherent stresses result for example between the coating and the substrate and between the individual layers of the coating from the different coefficients of thermal expansion of the materials. The inherent stresses can be tension or compression inherent stresses. When a coating is applied by means of PVD methods additional stresses are introduced into the coating by ion bombardment when using that method. In coatings applied by means of PVD methods compression inherent stresses generally prevail whereas CVD methods usually produce tension inherent stresses in the coating.

The effect of the inherent stresses in the coating and in the substrate body can be without a considerable influence on the properties of the cutting insert, but they can also have considerable advantageous or disadvantageous effects on the wear resistance of the cutting insert. Tension inherent stresses which exceed the tensile strength of the respective material cause fractures and cracks in the coating perpendicularly to the direction of the tension inherent stress. In general a certain amount of compression inherent stress in the coating is desired as surface cracks are prevented or closed thereby and the fatigue properties of the coating and thus the cutting insert are improved. Excessively high compression inherent stresses however can lead to adhesion problems and spalling of the coating.

There are 3 kinds of inherent stresses: macrostresses which are almost homogenously distributed over macroscopic regions of the material, microstresses which are homogenous in microscopic regions like for example a grain, and non-homogenous microstresses which are also non-homogenous on a microscopic plane. From a practical point of view and for the mechanical properties of a cutting insert macrostresses are of particular significance.

Inherent stresses are usually specified using the unit Megapascal (MPa), wherein tension inherent stresses have a positive sign (+) and compression inherent stresses have a negative sign (−).

It is known that hard metal cutting tools which are coated with hard material layers like for example TiN, TiC, TiCN, TiAlN, $Al_2O_3$ or combinations thereof can have excellent wear resistance but they can rather fail in a situation involving thermomechanical alternating loading in interrupted cutting operations as for example in crankshaft milling, by virtue of a loss in toughness in relation to uncoated cutting tools or those which are coated by means of PVD methods. A similar consideration applies to turning working in an interrupted cutting mode or under disadvantageous cutting conditions (for example vibrations caused by the machine or the workpiece clamping). For such applications under disadvantageous conditions, hitherto CVD coatings with a limited layer thickness (rarely more than 10 µm) are used as the embrittlement of the cutting material, caused inter alia by tensile stresses, increases with the thickness of the CVD coating. Highly wear-resistant kinds of cutting materials in contrast frequently involve layer thicknesses of 20 µm or more, but they can only be used in a continuous cutting mode under advantageous conditions. In the case of cutting inserts for turning working of steel or cast iron therefore both high wear resistance and also high toughness are desired, these being two properties which frequently cannot be achieved at the same time.

DE-A-197 19 195 describes a cutting insert have a multi-layer coating which is deposited in a continuous CVD method at temperatures between 900° C. and 1100° C. The change in material in the multi-layer coating from one layer to the next occurs due to a change in the gas composition in the CVD method. The outermost layer (cover layer) comprises a single-phase or multi-phase layer of carbides, nitrides or carbonitrides of Zr or Hf, in which internal compression inherent stresses prevail. The subjacent layers comprise TiN, TiC or TiCN and without exception have internal tension inherent stresses. The compression inherent stress measured in the outer layer is between −500 and −2500 MPas. That is intended to improve fracture toughness.

To increase the compression inherent stresses in the coating on the substrate body of cutting inserts or other tools it is known for them to be subjected to a mechanical surface treatment. Known mechanical surface methods are brushing and jet blasting treatment. Jet blasting treatment involves directing a fine-grain jet blasting agent of grain sizes of up to about 600 µm by means of compressed air under increased pressure on to the surface of the coating. Such a surface treatment can reduce tension inherent stresses or compression inherent stresses in the outermost layer and also in the subjacent layers. In regard to jet blasting treatment a distinction is drawn between dry jet blasting treatment in which the fine-grain jet blasting agent is used in the dry condition and wet jet blasting treatment in which the granular jet blasting agent is suspended in a liquid.

It was found that the choice of the jet blasting agent has a considerable influence on the changes in the inherent stresses in the coating and in the substrate of the cutting insert, in particular the hardness of the jet blasting agent in relation to the hardness and thickness of the coating. It was possible to show that, when using a jet blasting agent whose hardness is greater than that of the outermost layer of the coating, the wear mechanism in the jet blasting procedure is abrasion and high compression stresses occur only at the near surface regions of the layer to about 1 μm depth of penetration, and they very quickly relax again. In deeper layers or in the substrate there is substantially no reduction in the tension stresses or increase in the compression stresses. The inherent stress prevailing in the substrate after the coating process remains unchanged. It is not possible to achieve an increase in the toughness of the tool.

If the hardness of the jet blasting agent is equal to the hardness of the outermost layer of the coating then the wear mechanism in the jet blasting operation is surface spalling and there are high compression stresses which can act into deeper coating layers and in dependence on the layer thickness also into the substrate. With thick layers (>>10 μm) with wet jet blasting the stress in the substrate can be only little altered and tensile strength can be increased. If nonetheless there is a wish to increase the compression stress in the substrate even with thick layers, it is necessary to use very long dry jet blasting operations, which leads to an increase in lattice dislocations and can cause adhesion problems with the coating.

If the hardness of the jet blasting agent is less than that of the outermost layer of the coating surface bombardment (shot peening) is also substantially assumed as the wear mechanism of that outermost layer. The wear rate at the outermost coating is lower so that longer jet blasting times are possible without any layer removal worth mentioning. A further advantage is that in that respect no or only slight degrees of dislocation are produced in the uppermost layers of the coating. Depending on the respective choice of the method parameters (inter alia jet blasting agent, pressure, duration and angle) and layer thickness inherent stress changes can be achieved in different depths of the composite consisting of the hard metal and the coating. In other words, as a result of the jet blasting treatment, compression stresses can occur in different layers of the coating and also in the substrate.

DE-A-101 23 554 describes a jet blasting method using a granular jet blasting agent of a maximum diameter of 150μ. As a result, a reduction in tension inherent stresses or an increase in compression stresses is achieved in the outermost layer and the subjacent layers, preferably in the region near the surface of the substrate. Preferably compression stresses of some GPa are achieved in the uppermost layers.

Cutting inserts with an outer wear protection layer of alpha or gamma aluminium oxide for metal working have been in use for many years and are described in detail in the literature. It has been found that alpha aluminium oxide coatings with given preferential directions of crystal growth in deposition in the PVD or CVD methods can have particular advantages, in particular an improved wear characteristic, in which respect for different applications of the cutting insert different preferential orientations of the aluminium oxide layer can also be particularly advantageous. The preferential orientation of crystal growth is generally specified in relation to the planes defined by way of the Miller indices, for example the (001) plane, of the crystal lattice and are referred to as texture or fibre texture and are defined by way of a so-called texture coefficient (TC). For example cutting inserts with a wear layer of alpha aluminium oxide with (001) texture have advantages over other preferential orientations in steel machining in respect of relief face wear and crater wear as well as plastic deformation.

US-A-2007/0104945 describes cutting tools with α-$Al_2O_3$ wear layers with (001) texture and a columnar microstructure. That preferential orientation is revealed by high intensities of the (006) peak in the X-ray diffraction spectrum (XRD diffractogram) and is achieved by both nucleation and also growth of the α-$Al_2O_3$ layer being performed in the CVD method under given conditions. Nucleation is effected at ≤1000° C. on a TiAlCNO bonding layer by a multi-stage method in which the substrates are successively exposed to defined gas concentrations of $TiCl_4$ and $AlCl_3$, flushing steps in $N_2$ and defined $H_2O$ concentrations. Nucleation of α-$Al_2O_3$ is then continued by growth without catalytic additives and finally at 950 to 1000° C. layer growth to the desired layer thickness takes place under a defined concentration ratio of $CO/CO_2$ and in the presence of typical catalysts like $H_2S$, $SO_2$ or $SF_6$, in concentrations≤1% by volume.

EP 1 953 258 also describes cutting tools with α-$Al_2O_3$ wear layers with a (001) texture on hard metal substrates with an edge zone enriched with Co binder. The preferential orientation of the α-$Al_2O_3$ wear layer is achieved by nucleation similarly to US-A-2007/0104945, but it will be noted that as a departure therefrom upon further growth of the layer the $CO/CO_2$ ratio gradually increases.

EP-A-2 014 789 also describes cutting tools with α-$Al_2O_3$ wear layers with a (001) texture on hard metal substrates with an edge zone enriched with Co binder, which are said to be suitable in particular for cutting machining of steel at high cutting speeds, in particular for steel turning.

OBJECT OF THE INVENTION

The object of the present invention is to provide cutting inserts for cutting metal working, in particular turning working of steel or cast materials, which have a wear resistance that is improved in comparison with the state of the art, in particular increased resistance at the same time to wear forms which occur under a continuous loading, like relief face wear, crater wear and plastic deformation, and also in relation to wear forms which occur with a thermomechanical alternating loading like break-offs, fractures and comb cracks, and which thus afford a broader area of application than known cutting inserts.

DESCRIPTION OF THE DRAWING FIGURES

DESCRIPTION OF THE INVENTION

Figure 1:
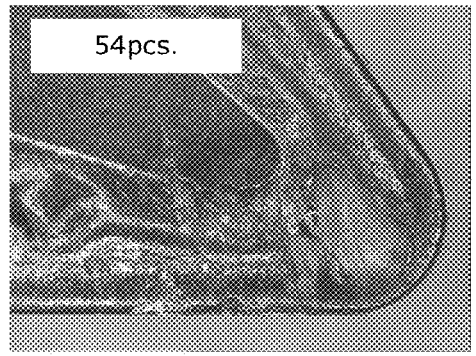
FIG. 1 shows the tool according to the state of the art (cutting insert 11 of Table 5) after the machining of 54 components.
Figure 1:
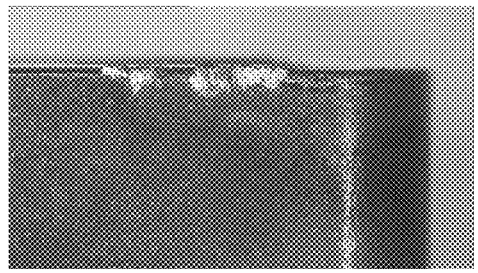

That object is attained by a cutting insert made of a hard metal, cermet or ceramic substrate body and a multi-layer coating which is applied thereto by means of CVD methods of a total thickness of 5 to 40 μm and which starting from the substrate surface has one or more hard material layers, over the hard material layers an alpha aluminium oxide (α-$Al_2O_3$) layer of a layer thickness of 3 to 20 μm and optionally at least portion-wise over the α-$Al_2O_3$ layer one or more further hard material layers as decorative or wear recognition layers, wherein the α-$Al_2O_3$ layer has a crystallographic preferential orientation, characterised by a texture coefficient TC (0 0 12)≥5 for the (0 0 12) growth direction with $$TC(0\ 0\ 12) = \frac{I(0\ 0\ 12)}{I_0(0\ 0\ 12)}\left[\frac{1}{n}\sum_{n=1}^{n}\frac{I(hkl)}{I_0(hkl)}\right]^{-1},$$

wherein
I(hkl) are the intensities of the diffraction reflections measured by X-ray diffraction,
$I_0$(hkl) are the standard intensities of the diffraction reflections in accordance with pdf card 42-1468, n is the number of reflections used for the calculation, and
the following reflections are used for the calculation of TC(0 0 12):

(0 1 2), (1 0 4), (1 1 0), (1 1 3), (1 1 6), (3 0 0) and (0 0 12), the α-Al$_2$O$_3$ layer has an inherent stress in the region of 0 to +300 MPas, and
the substrate within a region of 0 to 10 μm from the substrate surface has an inherent stress minimum in the region of −2000 to −400 MPas.

It was surprisingly found that, in a cutting insert with a coating of the kind described herein, in cutting metal working, in particular in the turning working of steel or cast materials, it is possible to achieve a wear resistance which is improved over known cutting inserts and a broader area of application if the hard α-Al$_2$O$_3$ layer serving as the wear layer has a crystallographic preferential orientation with a texture coefficient TC (0 0 12)≥5 and at the same time a low tension inherent stress in the range of 0 to +300 MPas or even a compression inherent stress and at the same time the substrate in a zone which extends from the substrate surface to a depth of penetration of 10 μm and which is referred to as the "near interface substrate zone" of the substrate body has a compression inherent stress in the region of −2000 to −400 MPas.

The combination according to the invention of the crystallographic preferential orientation of the α-Al$_2$O$_3$ layer and the defined parameters of the inherent stresses of the α-Al$_2$O$_3$ layer and the substrate body in the near interface substrate zone affords cutting inserts which are distinguished in that they both have increased resistance to forms of wear which occur in a continuous loading like relief face wear, crater wear and plastic deformation, and also forms of wear which occur in thermomechanical alternating loading like break-offs, fracture and comb cracks. In comparison known cutting inserts are generally designed for a given kind of loading and are optimised for same and therefore frequently have a limited and highly specific area of application. The cutting insert according to the invention in contrast, by virtue of its increased resistance to various forms of wear, namely those which occur predominantly in a continuous loading situation and those which occur predominantly in a thermomechanical alternating loading situation, has a broader area of application than known cutting inserts.

In a preferred embodiment of the cutting insert according to the invention the production of the cutting insert includes the substrate being subjected to a dry or wet jet blasting treatment, preferably a dry jet blasting treatment, using a granular jet blasting agent, after application of the multi-layer coating, wherein the jet blasting agent preferably has a lower level of hardness than corundum (α-Al$_2$O$_3$).

The inherent stresses according to the invention in the Al$_2$O$_3$ layer and in the substrate body of the cutting insert can advantageously be achieved by the cutting insert being subjected to a dry or wet jet blasting treatment using a granular jet blasting agent, after application of the multi-layer coating to the substrate. In that case the jet blasting agent should be of lesser hardness than corundum (α-Al$_2$O$_3$), in particular if the multi-layer coating is of great thickness. For example particles of steel, glass or zirconium dioxide (ZrO$_2$) are suitable as the jet blasting agent. The jet blasting treatment is desirably carried out at a jet blasting agent pressure of 1 bar to 10 bars. The use of a jet blasting agent which is of lesser hardness than corundum in the above-mentioned pressure range has the advantage that in that case no or only slight degrees of dislocation are incorporated into the uppermost layers of the coating. The α-Al$_2$O$_3$ layer and the subjacent layers of the coating exhibit only little change in their inherent stresses.

The dry jet blasting treatment is particularly preferred as it ensures a more uniform application of the jet blasting pressure to the coating and the substrate body over the entire surface, than the wet jet blasting treatment. In the wet jet blasting treatment the formation of a film of liquid on the jet-blasted surface considerably damps down the implementation of inherent stresses in relation to dry jet blasting treatment, with comparable jet blasting pressure conditions. That gives rise to the danger that the application of the jet blasting pressure at the edges of tool, that is to say also at the important cutting edges, is substantially higher than to the smooth surfaces, which can have the result that the edges are damaged under the jet blasting pressure before there is at all a substantial or at least adequate application to the surfaces of the tool, that are essential for the cutting operations, in particular the rake face. Higher pressures are also possible, over a long period of time, by means of dry jet blasting treatment, without the tool being damaged thereby.

The duration of the jet blasting treatment, that is required for producing or setting the inherent stresses according to invention in the α-Al$_2$O$_3$ layer and the substrate body, and the required jet blasting pressure, are parameters which the man skilled in the art can determine within the limits defined herein, by simple experiments on non-blasted cutting inserts. Comprehensive information is not possible here as the inherent stresses which occur depend not only on the duration of the jet blasting treatment and jet blasting pressure, but also on the structure and thickness of the overall coating and also the composition and structure of the substrate. It will be noted in that respect that, in comparison with the jet blasting duration, the jet blasting pressure has the substantially greater influence on the change in the inherent stresses in the coating and the substrate body. The duration of the jet blasting treatment may not be too short so that the desired changes in the inherent stresses penetrate into the substrate body and the inherent stress values according to invention can be set. The optimum duration of the jet blasting treatment also depends on the installation used for same, the spacing, the nature and the orientation of the jet blasting nozzles and the movement of the nozzles over the blasted tool. Jet blasting treatment durations suitable for production of the cutting insert according to the invention are in the region of 10 to 600 seconds, but they can also be in the region of 15 to 60 seconds. Particularly if one or more layers over the α-Al$_2$O$_3$ layer are to be firstly removed by the jet blasting treatment a longer jet blasting treatment duration is desirable or required. Suitable jet blasting agent pressures are in the region of 1 to 10 bars, preferably 2 bars to 8 bars, particularly preferably 3 bars to 5 bars. The invention however is not restricted to the above-mentioned jet blasting treatment durations and jet blasting agent pressures.

The jet blasting agent can be for example steel, glass or ZrO$_2$. The inherent stress conditions according to the invention can be set with any of the stated or other suitable jet blasting agents. With knowledge of the invention, the man skilled in the art can select a medium which is desirable from method, technical installation or tribological points of view, and can arrive at suitable jet blasting parameters by simple tests. Preferably the jet blasting agent comprises spherical particles. The mean grain size of the jet blasting agent is desirably in the region of 20 to 450 μm, preferably 40 to 200 μm, particularly preferably 50 to 100 μm, but it does not have any substantial influence on the production of compression inherent stresses in the substrate body. However the mean grain size of the jet blasting agent influences the surface roughness of the outermost layer of the coating. A small mean grain size (fine grains) produces a smooth surface in the blasting operation whereas a high mean grain size gives a rough surface. The production of a smooth surface and thus the use of a jet blasting agent with a low mean grain size is thus preferred for the tools according to the invention. The Vickers hardnesses of the above-mentioned jet blasting agents are approximately in the region of 500 to 1500. According to the invention $Al_2O_3$ (corundum) is generally not suitable as the jet blasting agent.

The jet blasting angle, that is to say the angle between the treatment beam and the surface of the tool, also has a substantial influence on the introduction of compression inherent stresses. The maximum introduction of compression inherent stresses occurs with a jet angle of 90°. Lesser jet angles, that is to say inclined incidence of the jet blasting agent, result in more severe abrasion of the surface and a lesser degree of compression inherent stress introduction. The most severe abrasion action is achieved with jet angles of about 15° to 40°. With smaller jet angles it may be necessary to adopt a higher jet blasting pressure and/or a longer jet blasting time in order to achieve the introduction of compression inherent stresses, that corresponds to the introduction of such stresses with a jet blasting angle of 90°, with which the examples described herein were also performed. With knowledge of the invention however the man skilled in the art can easily ascertain those parameters which are to be applied when using smaller jet angles.

The term "surface-near region" of the substrate body denotes a region from the outermost surface of the substrate body to a depth of penetration of a maximum of 1 to 2 μm in the direction of the interior of the substrate body. Non-destructive and phase-selective analysis of inherent stresses is effected by means of X-ray diffraction methods. Angle-dispersive measurement in accordance with the $\sin^2 \psi$ method, that is widely used, delivers a mean value for the inherent stress component in one plane and in WC substrates allows inherent stress measurements only to very small depths of penetration of a maximum of 1 to 2 μm from the surface, that is to say only in the "surface-near region" of the substrate body.

The term "near interface substrate zone" of the substrate body denotes a region from the outermost surface of the substrate body to a depth of penetration of about 10 μm in the direction of the interior of the substrate body. Analyses of the inherent stress configuration in the "near interface substrate zone" were not possible with the previously applied method of angle-dispersive measurement with conventional laboratory sources. On the one hand, as mentioned above, the depth of penetration of the angle-dispersive measurement is limited to an only very short distance from the outermost surface of the substrate body. In addition angle-dispersive measurement in accordance with the $\sin^2 \psi$ method only supplies a mean value in one plane, for which reason this method cannot be used to measure stepwise changes or gradient variations in the inherent stresses within short distances, with that method. For the analysis of inherent stresses in the "near interface substrate zone" of the substrate body to a depth of penetration of about 10 μm therefore, an energy-dispersive measurement procedure was used for the cutting inserts of the general kind set forth, such energy-dispersive measurement allowing the analysis of inherent stress variations to a depth of penetration of about 10 μm while detecting the variation in the inherent stresses within that region.

The coating on the cutting insert according to the invention comprises a succession of different individual layers. Because of their differing compositions, production conditions and positions within the coating, those different layers generally also already involve different inherent stresses, that is to say tension or compression stresses of differing magnitudes, prior to the jet blasting treatment. Due to the jet blasting treatment the inherent stresses in the individual layers in turn change by virtue of their differing compositions, production conditions and positions within the coating, to differing degrees. A corresponding consideration also applies to the substrate where the inherent stresses and changes therein at different depths from the surface can also be of differing magnitudes. According to the invention measurement of the inherent stresses is limited to a region from the substrate surface to a depth of penetration of 10 μm. In WC substrates measurement of the inherent stresses in much greater depths is technically impossible.

In a preferred embodiment of the invention the hard material layers arranged over the substrate surface and under the α-$Al_2O_3$ layer and the hard material layers arranged at least portion-wise optionally over the α-$Al_2O_3$ layer comprise carbides, nitrides, oxides, carbonitrides, oxynitrides, oxycarbides, oxycarbonitrides, borides, boronitrides, borocarbides, borocarbonitrides, borooxynitrides, borooxocarbides or borooxocarbonitrides of the elements of groups IVa to VIIa of the periodic system and/or aluminium and/or mixed metal phases and/or phase mixtures of the afore-mentioned compounds.

In a further preferred embodiment of the invention the hard material layers arranged over the substrate surface and under the α-$Al_2O_3$ layer comprise TiN, TiCN and/or TiAlCNO, wherein the hard material layers respectively involve layer thicknesses in the region of 0.1 μm to 15 μm.

In particular the layer of TiAlCNO is suitable as a binding layer directly under the α-$Al_2O_3$ layer. If a hard material layer of TiAlCNO is arranged directly under the α-$Al_2O_3$ layer it is preferably of a layer thickness in the range of 0.1 μm to 1 μm. The TiAlCNO layer improves the adhesion of the α-$Al_2O_3$ layer and promotes growth of the aluminium oxide in the alpha modification and with the preferential orientation according to the invention. By virtue of its composition and microstructure it affords excellent binding to the TiCN layer. Good binding of the layers to each other is important to be able to apply high pressures in the jet blasting treatment without the layers spalling off.

Hard material layers of TiN or TiCN, if there are one or more thereof, preferably involve layer thicknesses in the region of 2 μm to 15 μm, particularly preferably in the region of 3 μm to 10 μm.

Preferably, arranged under the binding layer of TiAlCNO and under the α-$Al_2O_3$ layer is a TiCN layer which is desirably of the above-mentioned layer thickness in the region of 2 μm to 15 μm, preferably in the region of 3 μm to 10 μm. The TiCN layer is preferably applied using a high temperature CVD method (HT-CVD) or a medium temperature CVD method (MT-CVD), wherein the MT-CVD method is preferred for production of cutting tools as it affords columnar layer structures and by virtue of the lower deposition temperature reduces losses of toughness in the substrate.

In a further preferred embodiment of the invention the hard material layers arranged over the substrate surface and under the α-$Al_2O_3$ layer and comprising TiN, TiCN and/or TiAlCNO are together of a total layer thickness in the region of 3 μm to 16 μm, preferably in the region of 5 μm to 12 μm, particularly preferably in the region of 7 μm to 11 μm.

In a further preferred embodiment of the invention the multi-layer coating starting from the substrate surface has the following layer succession: TiN—TiCN—TiAlCNO-α-$Al_2O_3$, wherein optionally a TiN layer, a TiCN layer, a TiC layer or a combination thereof are provided at least portion-wise over the α-$Al_2O_3$ layer.

The cutting insert according to the invention can have at least portion-wise over the α-Al$_2$O$_3$ layer one or more further hard material layers, preferably a TiN layer, a TiC layer, a TiCN layer or a combination thereof. Such layers are frequently applied as decorative and/or wear recognition layers to the α-Al$_2$O$_3$ layer which appears black, and they themselves are of a yellow-golden or grey-silver colour and can serve as an indicator for use of the tool as those layers are worn away in metal working. Usually such decorative and/or wear recognition layers are not applied to such surfaces of the tool or after deposition on the entire tool body are removed again from such surfaces, which in metal working come directly into contact with the metal, for example the rake faces, as they can have detrimental effects on the working operation depending on the respective working method and workpiece material involved. Usually the decorative and/or wear recognition layers are abrasively removed from the corresponding surfaces by jet blasting or brushing treatment. Such abrasive removal of the thin or soft decorative layers can cause an introduction of compression inherent stresses into the remaining α-Al$_2$O$_3$ layer, but only in the surface-near regions of <1 μm depth of penetration so that there is no significant change in the inherent stress condition according to the invention of the α-Al$_2$O$_3$ layer. By virtue of the slight attenuation of X-ray radiation by α-Al$_2$O$_3$ that surface-near region is in any case scarcely accessible in terms of measuring technology by X-ray radiographic inherent stress measurement or is so accessible only by extrapolation. With the measurement parameters used here in respect of the sin$^2$ ψ method and tilt angles up to ψ=89.5° the ascertained inherent stress of the α-Al$_2$O$_3$ layer originates from an information depth of about ≥1.5 μm.

For setting the inherent stress condition according to the invention in the cutting tool, use is made of a jet blasting treatment with a jet blasting agent whose hardness is preferably less than that of the α-Al$_2$O$_3$ layer. It is then assumed that the wear mechanism acting on the α-Al$_2$O$_3$ layer is essentially shot peening. No substantial removal of the α-Al$_2$O$_3$ layer occurs and high compression inherent stresses are generated in the substrate body by that mechanism and that method, even if the total layer thickness of the coating is up to 40 μm in magnitude.

The total layer thickness of the coating is at least 5 μm, preferably at least 10 μm, particularly preferably at least 15 μm. At excessively small total layer thickness of the coating has the disadvantage that there is no longer any guarantee of adequate wear protection by the coating.

In a further preferred embodiment of the invention the substrate body comprises hard metal, preferably containing 4 to 12% by weight of Co, Fe and/or Ni, preferably Co, optionally 0.5 to 10% by weight of cubic carbides of the metals of groups IVb, Vb and VIb of the periodic system, preferably Ti, Nb, Ta or combinations thereof, and WC as the balance.

In a further embodiment of the invention the substrate body comprises hard metal of the above-mentioned composition and has a surface zone which is enriched with Co binder phase in relation to the nominal overall composition of the substrate body and which is depleted of cubic carbides and which starting from the substrate surface is of a thickness of 5 μm to 30 μm, preferably 10 μm to 25 μm, wherein the content of Co in the surface zone enriched with Co binder phase is at least 1.5 times higher than in the core of the substrate and the content of cubic carbides in the surface zone enriched with Co binder phase is at most 0.5 times the content of cubic carbides in the core of the substrate.

The provision of a surface zone enriched with Co binder phase in the hard metal substrate improves the toughness of the substrate body and opens up a wider area of use of the tool, wherein hard metal substrates with a surface zone enriched with Co binder phase are preferably used for cutting tools for machining steel, whereas cutting tools for machining cast irons are preferably produced without such a surface zone enriched with Co binder phase.

The present invention also includes a method for production of the cutting insert according to the invention described herein, in which there is applied to a substrate body of hard metal, cermet or ceramic by means of CVD methods a multi-layer coating which is of a total thickness of 5 to 40 μm and which starting from the substrate surface has one or more hard material layers, over the hard material layers an alpha aluminium oxide (α-Al$_2$O$_3$) layer of a layer thickness of 1 to 20 μm and optionally at least portion-wise over the α-Al$_2$O$_3$ layer one or more further hard material layers as decorative or wear recognition layers wherein the deposition conditions for the α-Al$_2$O$_3$ layer are so selected that the α-Al$_2$O$_3$ layer has a crystallographic preferential orientation, characterised by a texture coefficient TC (0 0 12)≥5 for the (0 0 12) growth direction with $$TC(0\ 0\ 12) = \frac{I(0\ 0\ 12)}{I_0(0\ 0\ 12)} \left[ \frac{1}{n} \sum_{n=1}^{n} \frac{I(hkl)}{I_0(hkl)} \right]^{-1},$$

wherein

I(hkl) are the intensities of the diffraction reflections measured by X-ray diffraction, I$_0$(hkl) are the standard intensities of the diffraction reflections in accordance with pdf card 42-1468, n is the number of reflections used for the calculation, and the following reflections are used for the calculation of TC(0 0 12):

(0 1 2), (1 0 4), (1 1 0), (1 1 3), (1 1 6), (3 0 0) and (0 0 12), and after application of the multi-layer coating the substrate is subjected to a dry or wet jet blasting treatment, preferably a dry jet blasting treatment, using a granular jet blasting agent, wherein the jet blasting agent is preferably of a lower hardness than corundum (α-Al$_2$O$_3$) and wherein the jet blasting pressure, the jet blasting duration and the jet blasting angle of the jet blasting treatment are so selected that after the jet blasting treatment the α-Al$_2$O$_3$ layer has an inherent stress in the region of 0 to +300 MPas, and the substrate after the jet blasting treatment within a region of 0 to 10 μm from the substrate surface has an inherent stress minimum in the region of −2000 to −400 MPas.

Measuring Methods

Non-destructive and phase-selective analysis of inherent stresses is only possible by X-ray diffraction methods (see for example V Hauk. Structural and Residual Stress Analysis by Nondesctructive Methods. Elsevier, Amsterdam, 1997). The sin$^2$ ψ method which is widely used (E Macherauch, P Müller, Z. angew. Physik 13 (1961), 305) for X-ray analysis of inherent stresses is based on the assumption of a homogenous stress condition within the depth of penetration of the X-ray beam and provides only a mean value for the stress component in one plane. Therefore the sin$^2$ ψ method is not suitable for the investigation of multi-layer, jet-treated CVD systems in which steep or stepwise changes in the inherent stress are expected within short distances. Instead in such cases more developed methods such as for example the "Universal Plot Method" are used, which even in thin layers allow the detection of inherent stress gradients (Ch. Genzel in: E J Mittemeijer, P Scardi (editor) Diffraction Analysis of the Microstructure of Materials. Springer Series in Material Science, Volume 68 (2004), page 473; Ch. Genzel, Mat. Science and Technol. 21 (2005), 10). As the inherent stresses according to the invention are advantageously achieved by a dry jet blasting treatment using a jet blasting agent whose hardness is less than that of corundum ($\alpha$-$Al_2O_3$), no or only very slight degrees of dislocation and only a slight change in the inherent stress are caused in the $\alpha$-$Al_2O_3$ layer. Decorative or wear recognition layers optionally arranged over the $\alpha$-$Al_2O_3$ layer are removed by abrasively acting methods which for their part change the inherent stress condition in the remaining $\alpha$-$Al_2O_3$ layer only in the near surface regions of the layer to about 1 µm depth of penetration. In the case of the measurement parameters used here the measuring signal in respect of the $\alpha$-$Al_2O_3$ layer originates from an information depth of about ≥1.5 m. As the measurement data did not provide any indication of severe inherent stress depth gradients in the $\alpha$-$Al_2O_3$ layer they were evaluated using the $\sin^2 \psi$ method.

The inherent stresses in the layers were measured in the angle-dispersive diffraction mode on a GE Inspection Technologies (formerly Seifert), 5-Circle-Diffractometer ETA (Ch. Genzel, Adv. X-Ray Analysis, 44 (2001) 247). The parameters used for the measurements and for determining the inherent stresses are summarised in Table 1 hereinafter.

Non-destructive analysis of the inherent stress distribution in the region of the interface between the substrate body and the coating is possible only by high-energy X-ray diffraction using intensive parallel synchrotron radiation. To ascertain the influence of the jet blasting method on the condition of the inherent stress in the proximity of the substrate surface energy-dispersive diffraction was employed. In that case the "modified multi-wavelength method" (as is described in C Stock, Promotionsarbeit, T U Berlin, 2003; Ch. Genzel, C Strock, W Reimers, Mat. Sci. Eng., A 372 (2004), 28), which determines the depth profile of the inherent stresses in the substrate to a depth of penetration dependent on the substrate material. In the case of WC—Co substrates that depth of penetration is about 10 µm. The experiments were performed on the EDDI (Energy Dispersive Diffraction) material research measurement station which is operated by the Berlin Helmholtz-Zentrum für Materialien and Energie GmbH on the BESSY Synchrotron Storage Ring (Ch. Genzel, I A Denks, M Klaus, Mat. Sci. Forum 524-525 (2006), 193). The corresponding experimental parameters are set forth in Table 2.

TABLE 1

Experimental parameters for inherent stress analysis of the coating

| | |
|---|---|
| Radiation | CuKα (without Kβ-Filter) 40 kV/45 mA (long fine focus) |
| Diffraction mode | Angle-dispersive |
| Optical elements | Primary beam: polycapillary half-lens Diffracted beam: parallel beam optics (0.4° Soller aperture + 001-LiF monochromator) |
| Reflections | $Al_2O_3$: 116 (2θ = 57.5°) Measurement range in 2θ: 56.0° ≤ 2θ ≤ 59.0°; Δ2θ = 0.05° |
| ψ-range | 0° ... 89.5° ($\sin^2\psi$ = 0 ... 0.99996) Step width for 0 ≤ ψ ≤ 80°: $\Delta\sin^2\psi$ = 0.05°; for ψ > 80°: Δψ = 0.5° |
| Measurement duration | 15 s/step in 2θ (0.05°) |
| Diffraction line evaluation | Pearson VII-function for the $K\alpha_1$- and $K\alpha_2$-lines |
| Linear absorption coefficient | $\mu_{Al2O3}$ = 124 $cm^{-1}$ |

TABLE 1-continued

Experimental parameters for inherent stress analysis of the coating

| | |
|---|---|
| Elastic diffraction constant (DEC)*) | $Al_2O_3$: $s_1$ (116) = −0.474 × $10^{-6}$ $MPa^{-1}$ ½ $s_2$ (024) = 2.83 × $10^{-6}$ $MPa^{-1}$ |

*)Calculated on the basis of the monocrystal elasticity constants of $Al_2O_3$ (Landoldt-Börnstein, New Series, Group III, Volume 11, Springer, Berlin, 1979) and TiN (W. Kress, P. Roedhammer, H. Bilz, W. Teuchert, A. N. Christensen. Phys. Rev. B17 (1978), 111.) according to the Eshelby-Kröner model (J. D. Eshelby. Proc. Roy. Soc. (London) A241 (1957), 376; E. Kröner, Z. Physik 151 (1958), 504.)

TABLE 2

Experimental parameters for inherent stress analysis in the substrate bodies

| | |
|---|---|
| Radiation | white synchrotron radiation, E = [10 keV ... 120 keV] |
| Diffraction mode | Energy-dispersive |
| Beam cross-section | 0.25 × 0.25 $mm^2$ |
| Absorber | 2 cm graphite |
| Optics in the diffracted beam | Double gap system with an aperture of 0.03 × 5 $mm^2$ |
| Diffraction angle | 2θ = 11° |
| Detector | Solid state-LEGe-detector (Canberra) |
| Measurement mode | symmetrical ψ-mode (reflection), ψ = 0° ... 89°, Δψ = 4° for 0 ≤ ψ ≤ 70° Δψ = 2° for 70° < ψ ≤ 80° Δψ = 1° for 80° < ψ ≤ 89° |
| Measurement duration | 60 s/diffractions spectrum |
| Evaluated diffraction lines | 001, 101, 110, 002, 201, 112 |
| Elastic diffraction constants | Taken from B. Eigenmann, E. Macherauch, Mat.-Wiss. u. Werkstofftechn. 27 (1996), 426 |
| Calibration | With stress-free W powder under the same experimental conditions |

Texture measurements were carried out on a XRD3003PTS diffractometer from GE Sensing and Inspection Technologies using Cu $K_\alpha$ radiation. The X-ray tube was operated at 40 kV and 40 mA in the spot focus mode. At the primary side a polycapillary half-lens with a measuring aperture of fixed size was used, wherein the blasted surface of the sample was so selected that the X-ray beam is incident only on the coated surface. At the secondary side a Soller gap with 0.4° divergence and a 0.25 mm thick Ni $K_\beta$ filter were used. Scans were performed in a θ-2θ arrangement in the angle range of 20°<2θ<100° with a step width of 0.25°. The measurements were carried out on a flat surface of the coated cutting insert, preferably at the relief face. The measurements were performed directly at the aluminium oxide layer as the outermost layer. In the situation where there is a further layer over the aluminium oxide to be measured then that is removed prior to the measurement by a method which does not substantially influence the measurement results, for example by etching. To calculate the texture coefficient TC(0 0 12) the peak height intensities were used. Background stripping and a parabolic peak fit at 5 measurement points were applied to the measured raw data. No further corrections of the peak intensities like for example $K_{\alpha 2}$ stripping or thin-film layer corrections were implemented.

The jet blasting treatment used for setting the inherent stress condition according to the invention does not create any significant change in integral line widths and intensities of the diffraction reflections. The effects of abrasively acting post-treatment methods which are used to remove cover layers arranged over the $\alpha$-$Al_2O_3$ layer are admittedly slight according to experience, but are not excluded. Therefore measurement of the texture in the case of the cutting inserts according to the invention is to be performed at surfaces which are not subjected to such post-treatment steps, for example at the relief face of the cutting insert.

The texture coefficient TC(0 0 12) is defined as follows:

$$TC(0\ 0\ 12) = \frac{I(0\ 0\ 12)}{I_0(0\ 0\ 12)}\left[\frac{1}{n}\sum_{n=1}^{n}\frac{I(hkl)}{I_0(hkl)}\right]^{-1},$$

wherein

I(hkl) are the intensities of the diffraction reflections which as described above are measured by X-ray diffraction and corrected, $I_0$(hkl) are the standard intensities of the diffraction reflections in accordance with pdf card 42-1468, n is the number of reflections used for the calculation, and the following reflections are used for the calculation of TC(0 0 12):

(0 1 2), (1 0 4), (1 1 0), (1 1 3), (1 1 6), (3 0 0) and (0 0 12).

The relative intensity of the (0 0 12) diffraction reflection given by the texture coefficient TC(0 0 12) is a measurement in respect of the (0 0 1) preferential orientation or fibre texture of the $\alpha$-$Al_2O_3$ layer. Alternatively to evaluation of the (0 0 12) reflection it is also possible to evaluate the texture by way of the (0 0 6) diffraction reflection as TC(0 0 6). The use of the (0 0 12) reflection is however to be preferred for the coatings according to the invention because the (0 0 6) reflection of the $\alpha$-$Al_2O_3$ cannot always be reliably separated from the frequently highly intensive (2 0 0) reflection of TiCN.

EXAMPLES

Example 1

WC/Co hard metal substrate bodies (indexable cutting bits of various compositions (HM1, HM2, HM3, HM4, HM5 and HM6) were coated in a CVD method in the layer sequence TiN-MT-TiCN-$\alpha$-$Al_2O_3$—HT-TiCN with various layer thicknesses for the individual layers. A thin (<1 μm) binding and nucleation layer of TiAlCNO was deposited between the MT-TiCN layer and the $\alpha$-$Al_2O_3$ layer. All coatings were produced in a CVD reactor of Bernex BPX325S type with a radial gas flow.

The MT-TiCN layer was deposited at a pressure of 90 mbars and with the following gas concentrations (percentages in relation to the gases in the CVD method denote % by volume): 2.0% $TiCl_4$, 0.5% $CH_3CN$, 10% $N_2$, 87.5% $H_2$.

A thin (<1 μm) binding and nucleation layer was deposited between the MT-TiCN layer and the $\alpha$-$Al_2O_3$ layer in three process steps.

1. Ti(C,N)—duration: 20 min, temperature: 1000° C., pressure: 500 mbars, gas concentrations: 5% $CH_4$, 2% $TiCl_4$, 25% $N_2$, balance $H_2$ 2. (Ti,Al)(C,N,O)—duration: 15 min, temperature: 1000° C., pressure: 75 mbars, gas concentrations: 5% CO, 1% $AlCl_3$, 2% $TiCl_4$, 25% $N_2$, balance $H_2$ 3. (Ti,Al)(C,N,O)—duration: 5 min, temperature: 1000° C., pressure: 175 mbars, gas concentrations: 5% CO, 2.5% $CO_2$, 1% $AlCl_3$, 2% $TiCl_4$, 20% $N_2$, balance $H_2$ Then the $\alpha$-$Al_2O_3$ layer was nucleated by the following method:

1. Flushing with Ar, duration 5 min

2. Treatment with 2% $TiCl_4$, 2% $AlCl_3$, balance $H_2$, at T=1000° C., p=175 mbar, duration 5 min 3. Flushing with Ar, duration 5 min 4. Oxidation with 2.5% $CO_2$, 12% CO, balance $H_2$ at T=1000° C., p=175 mbar, duration 5 min 5. Flushing with Ar, duration 5 min 6. Treatment with 2.5% $AlCl_3$, balance $H_2$, at T=1000° C., p=175 mbar, duration 1 min.

For further nucleation a thin $\alpha$-$Al_2O_3$ start layer was deposited without using catalytic compounds under the following conditions:

T=1010° C.; p=75 mbars; 2.5% $CO_2$; 2.0% HCl; 2.0% CO; 2.0% $AlCl_3$; balance $H_2$, duration 40 min.

The growth conditions of the $\alpha$-$Al_2O_3$ layer according to the invention were selected as follows:

T=1010° C., p=85 mbars, gas concentrations: 91% $H_2$, 3.0% $CO_2$, 0.5% $H_2S$, 3.5% HCl, 2.5% $AlCl_3$. All gas components are introduced simultaneously in the specified levels of concentration.

The $\alpha$-$Al_2O_3$ layers produced had a very high (0 0 1) preferential orientation with a texture coefficient TC(0 0 12)>5.

As a reference, hard metal substrate bodies of the same compositions were also coated with the layer sequence TiN-MT-TiCN-$\alpha$-$Al_2O_3$—HT-TiCN with the same layer thicknesses of the individual layers, wherein a thin (<1 μm) binding and nucleation layer of TiAlCNO was also deposited between the MT-TiCN layer and the $\alpha$-$Al_2O_3$ layer. Thereupon the $\alpha$-$Al_2O_3$ layer was nucleated, in accordance with the state of the art.

The growth conditions of the $\alpha$-$Al_2O_3$ layer in accordance with the state of the art were selected as follows:

T=1015° C., p=65 mbars, gas concentrations: 92.3% $H_2$, 3.5% $CO_2$, 0.2% $H_2S$, 2.0% HCl, 2.0% $AlCl_3$.

The $\alpha$-$Al_2O_3$ layers in accordance with the state of the art have only a moderate (0 0 1) preferential orientation.

The compositions of the hard metal substrate bodies used are set forth in Table 3. The layer thicknesses of the individual layers and the texture coefficient TC(0 0 12) intended for the $\alpha$-$Al_2O_3$ layer are set forth in Table 4.

TABLE 3

Hard metal compositions

| Hard metal | Composition (% by weight) | | | | Hardness HV3 |
|---|---|---|---|---|---|
| | Co | WC | Cubic metal carbide | Other | |
| HM1 | 7 | 86.5 | 5 | 0.5 | 1500 |
| HM2 | 7.5 | 87 | 5 | 0.5 | 1500 |
| HM3 | 6 | 94 | — | — | 1600 |
| HM4 | 5 | 86.5 | 8 | 0.5 | 1500 |
| HM5 | 5.5 | 86 | 8 | 0.5 | 1550 |
| HM6 | 10 | 81 | 8.5 | 0.5 | 1300 |

TABLE 4

| Layer system | | Layer thickness [μm] | | | | TC(0 0 12) |
|---|---|---|---|---|---|---|
| | | Total | TiN | MT-TiCN | $\alpha$-$Al_2O_3$ | HT-TiCN | |
| State of the art | a | 17 | 0.5 | 9 | 6 | 0.5 | 4.4 ± 0.7 |
| State of the art | b | 20 | 0.5 | 9 | 9 | 0.5 | 4.5 ± 0.9 |
| State of the art | c | 20 | 0.5 | 6 | 12 | 0.5 | 4.9 ± 0.4 |
| State of the art | d | 10 | 0.5 | 4 | 4 | 0.5 | 2.5 ± 0.4 |
| Invention | A | 17 | 0.5 | 9 | 6 | 0.5 | 6.0 ± 0.2 |
| Invention | B | 20 | 0.5 | 9 | 9 | 0.5 | 6.1 ± 0.3 |
| Invention | C | 20 | 0.5 | 6 | 12 | 0.5 | 6.2 ± 0.2 |
| Invention | D | 10 | 0.5 | 4 | 4 | 0.5 | 5.5 ± 0.5 |

The texture coefficients TC[0 0 12] are specified as mean values of measurements on ≥6 various cutting inserts from at least two different coating batches.

The cutting bits are then subjected to a jet blasting treatment and the inherent stresses of the α-Al$_2$O$_3$ layer and the substrate body are measured in the near interface substrate zone (NISZ). The results are set out in Table 5. The value "Inherent stress NISZ substrate" is in each case the minimum value within the measured inherent stress variations in the "near interface substrate zone".

Tool geometry: DNMG150608-NM4
Tool life: State of the art: cutting insert 11 according to Table 5: 54 components
Invention: cutting insert 14 according to Table 5: 80 components FIG. 1 shows the tool according to the state of the art (cutting insert 11 of Table 5) after the machining of 54 com-

TABLE 5

Results of the inherent stress measurements on cutting inserts

| Cutting insert | Hard metal | Layer system | Jet blasting treatment | Inherent stress α-Al$_2$O$_3$ [MPa] | Inherent stress TiCN [MPa] | Inherent stress NISZ substrate [MPa] |
|---|---|---|---|---|---|---|
| 1 (State of the art) | HM1 | A | unblasted | 136 | 598 | −350 |
| 2 (Invention) | HM1 | A | dry/ZrO$_2$/ 5 bar/120 sec | 96 | 255 | −600 |
| 3 (State of the art) | HM3 | a | unblasted | 331 | 221 | −230 |
| 4 (State of the art) | HM3 | a | dry/ZrO$_2$/ 5 bar/120 sec | 197 | 323 | −625 |
| 5 (State of the art) | HM3 | A | unblasted | 278 | 713 | −375 |
| 6 (Invention) | HM3 | A | dry/ZrO$_2$/ 5 bar/120 sec | 206 | 478 | −510 |
| 7 (State of the art) | HM5 | a | unblasted | 256 | 330 | −290 |
| 8 (State of the art) | HM5 | a | dry/ZrO$_2$/ 5 bar/120 sec | 156 | 325 | −940 |
| 9 (State of the art) | HM5 | A | unblasted | 308 | 427 | −225 |
| 10 (Invention) | HM5 | A | dry/ZrO$_2$/ 5 bar/120 sec | 135 | 396 | −860 |
| 11 (State of the art) | HM6 | a | unblasted | 369 | 612 | −380 |
| 12 (State of the art) | HM6 | a | dry/ZrO$_2$/ 5 bar/120 sec | 156 | 525 | −976 |
| 13 (State of the art) | HM6 | A | unblasted | 411 | 544 | −204 |
| 14 (Invention) | HM6 | A | dry/ZrO$_2$/ 5 bar/120 sec | 147 | 257 | −1005 |
| 15 (State of the art) | HM2 | b | unblasted | 240 | 984 | −180 |
| 16 (State of the art) | HM2 | b | dry/ZrO$_2$/ 5 bar/120 sec | 98 | 595 | −580 |
| 17 (State of the art) | HM2 | B | unblasted | 224 | 1280 | −55 |
| 18 (Invention) | HM2 | B | dry/ZrO$_2$/ 5 bar/120 sec | 22 | 654 | −620 |
| 19 (State of the art) | HM4 | C | unblasted | 191 | 1140 | −280 |
| 20 (Invention) | HM4 | C | dry/ZrO$_2$/ 5 bar/120 sec | 77 | 733 | −720 |
| 21 (State of the art) | HM2 | D | unblasted | 435 | 870 | −180 |
| 22 (Invention) | HM2 | D | dry/ZrO$_2$/ 5 bar/120 sec | 121 | −16 | −920 |

Example 2

Cutting Machining Tests

The cutting bits produced in accordance with Example 1 were used to subject camshafts to external machining in the interrupted cutting mode in accordance with the following test parameters:
Work piece: camshaft
Material: 16MnCr5 (R$_m$=600–700N/mm$^2$)
Machining; Lengthwise turning in the interrupted cutting mode; wet machining
Cutting data: v$_c$=220 m/min
  f=0.4 mm
  a$_p$=2.5 mm ponents. After the end of the tool life both crater wear and also notch wear and break-out phenomena at the cutting edge are to be seen. Crater wear is a typical form of wear when turning steel materials, occurring because of a lack of wear resistance at high cutting temperature due to thermal overloading of the tool. The notches and break-outs at the cutting edge in contrast are signs of inadequate toughness of the tool under the selected working conditions.

Figure 2:
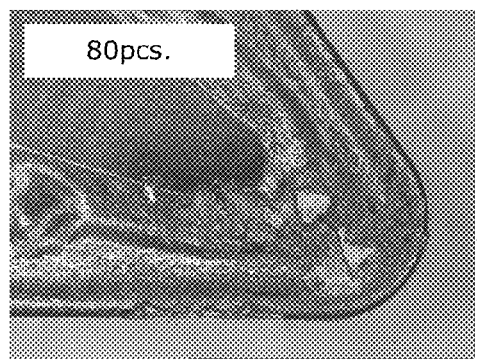
FIG. 2 shows the cutting insert according to the invention (cutting insert 14 of Table 5) after the machining of 80 components.
Figure 2:

FIG. 2 shows the cutting insert according to invention (cutting insert 14 of Table 5) after the machining of 80 components. The cutting insert has markedly less pronounced crater wear and no notches.

Example 3

Cutting Machining Tests

Cutting bits produced according to Example 1 were subjected to the so-called strip turning test (test using a severely interrupted cutting mode). In that test the toughness characteristic of indexable cutting bits is investigated, by a shaft equipped with four strips of heat-treatable steel being machined in an external lengthwise turning process. The strips which in that case are subjected to cutting machining represent only a part of the periphery so that a severely impacting action takes place on the tool cutting edges. The life of the tool is determined as the number of entries into the workpieces until failure of the cutting edge due to fracture (impact count).
Material: 42CrMo4; $R_m$=800 N/mm$^2$
Machining: Lengthwise turning in the interrupted cutting mode; dry machining
Cutting data: $v_c$=170
  f=0.32 mm
  $a_p$=2.5 mm
Tool geometry: CNMG120412-NM4
Tool life/impact count (respective mean value from 6 tested cutting inserts):
  State of the art: Cutting insert 15 according to Table 5: 497 impacts
  Invention: Cutting insert 18 according to Table 5: 2946 impacts

Example 4

Cutting Machining Tests

Cutting bits produced according to Example 1 were used to subject pump housings of spheroidal graphite cast iron GGG50 to turning machining (roughing in the interrupted cutting mode) in accordance with the following test parameters:
Workpiece: pump housing
Material: GGG50
Machining: Turning in the interrupted cutting mode; dry machining
Cutting data: $v_c$=190 m/min
  f=0.5 mm
  $a_p$=3.0 mm
Tool geometry: WNMA080412
Tool life: State of the art: Cutting insert 3 according to Table 5: 70 components
  Invention: Cutting insert 6 according to Table 5: 200 components

The invention claimed is:

1. A cutting insert:
a hard metal, cermet or ceramic substrate body; and
a multi-layer coating which is applied thereto by means of CVD methods of a total thickness of 5 to 40 μm and which starting from a surface of the substrate body has one or more hard material layers, over the hard material layers an alpha aluminium oxide (α-Al$_2$O$_3$) layer of a layer thickness of 1 to 20 μm and optionally at least portion-wise over the α-Al$_2$O$_3$ layer one or more further hard material layers as decorative or wear recognition layers,
wherein the α-Al$_2$O$_3$ layer has a crystallographic preferential orientation, characterised by a texture coefficient TC (0 0 12)≥5 for the (0 0 12) growth direction with $$TC(0\ 0\ 12) = \frac{I(0\ 0\ 12)}{I_0(0\ 0\ 12)} \left[ \frac{1}{n} \sum_{n=1}^{n} \frac{I(hkl)}{I_0(hkl)} \right]^{-1},$$

wherein
  I(hkl) are the intensities of the diffraction reflections measured by X-ray diffraction,
  $I_0$(hkl) are the standard intensities of the diffraction reflections in accordance with pdf card 42-1468,
  n is the number of reflections used for the calculation, and
  the following reflections are used for the calculation of TC(0 0 12):
    (0 1 2), (1 0 4), (1 1 0), (1 1 3), (1 1 6), (3 0 0) and (0 0 12),
wherein the α-Al$_2$O$_3$ layer has an inherent stress in the region of 0 to +300 MPas, and
wherein the substrate within a region of 0 to 10 μm from the surface of the substrate body has an inherent stress minimum in the region of −2000 to −400 MPas.

2. A cutting insert according to claim 1 wherein the production of the cutting insert includes the substrate body being subjected to a dry or wet jet blasting treatment using a granular jet blasting agent after application of the multi-layer coating.

3. A cutting insert according to claim 1 wherein the hard material layers arranged over the surface of the substrate body and under the α-Al$_2$O$_3$ layer and the hard material layers arranged at least portion-wise optionally over the α-Al$_2$O$_3$ layer comprise carbides, nitrides, oxides, carbonitrides, oxynitrides, oxycarbides, oxycarbonitrides, borides, boronitrides, borocarbides, borocarbonitrides, borooxynitrides, borooxocarbides or borooxocarbonitrides of the elements of groups IVa to VIa of the periodic system and/or aluminium and/or mixed metal phases and/or phase mixtures of the afore-mentioned compounds.

4. A cutting insert according to claim 1 wherein the hard material layers arranged over the surface of the substrate body and under the α-Al$_2$O$_3$ layer comprise TiN, TiCN and/or TiAlCNO, wherein the hard material layers respectively involve layer thicknesses in the region of 0.1 μm to 15 μm.

5. A cutting insert according to claim 1 wherein the hard material layers arranged over the substrate surface and under the α-Al$_2$O$_3$ layer and comprising TiN, TiCN and/or TiAlCNO are together of a total layer thickness in the region of 3 μm to 16 μm.

6. A cutting insert according to claim 1 wherein the multi-layer coating starting from the surface of the substrate body has the following layer succession: TiN—TiCN—TiAlCNO-α-Al$_2$O$_3$, wherein optionally a TiN layer, a TiCN layer, a TiC layer or a combination thereof are provided at least portion-wise over the α-Al$_2$O$_3$ layer.

7. A cutting insert according to claim 1 wherein, within a region from the outermost surface region to a depth of 10 μm from the outermost surface of the substrate body, the substrate body has an inherent stress minimum of at least −400 MPas, preferably at least −600 MPas.

8. A cutting insert according to claim 1 wherein the substrate body comprises hard metal, containing 4 to 12% by weight of Co, Fe and/or Ni, optionally 0.5 to 10% by weight of cubic carbides of the metals of groups IVb, Vb and VIb of the periodic system, or combinations thereof, and WC as the balance.

9. A cutting insert according to claim 1 wherein the substrate body comprises hard metal and has a surface zone which is enriched with Co binder phase in relation to a nominal overall composition of the substrate body and which is depleted of cubic carbides and which starting from the surface of the substrate body is of a thickness of 5 μm to 30 μm, wherein a content of Co in the surface zone enriched with Co binder phase is at least 1.5 times higher than in a core of the substrate and a content of cubic carbides in the surface zone enriched with Co binder phase is at most 0.5 times a content of cubic carbides in the core of the substrate.

10. A method for production of a cutting insert according to claim 1, comprising:
   applying to a substrate body of hard metal, cermet or ceramic by means of CVD methods a multi-layer coating which is of a total thickness of 5 to 40 μm and which starting from a surface of the substrate body includes one or more hard material layers, over the hard material layers an alpha aluminium oxide (α-Al$_2$O$_3$) layer of a layer thickness of 1 to 20 μm and optionally at least portion-wise over the α-Al$_2$O$_3$ layer one or more further hard material layers as decorative or wear recognition layers,
   wherein deposition conditions for the α-Al$_2$O$_3$ layer are so selected that the α-Al$_2$O$_3$ layer has a crystallographic preferential orientation characterised by a texture coefficient TC (0 0 12)≥5 for the (0 0 12) growth direction with $$TC(0\ 0\ 12) = \frac{I(0\ 0\ 12)}{I_0(0\ 0\ 12)} \left[ \frac{1}{n} \sum_{n=1}^{n} \frac{I(hkl)}{I_0(hkl)} \right]^{-1},$$

wherein
   I(hkl) are the intensities of the diffraction reflections measured by X-ray diffraction,
   I$_0$(hkl) are the standard intensities of the diffraction reflections in accordance with pdf card 42-1468,
   n is the number of reflections used for the calculation, and
   the following reflections are used for the calculation of TC(0 0 12):
   (0 1 2), (1 0 4), (1 1 0), (1 1 3), (1 1 6), (3 0 0) and (0 0 12),
   wherein after application of the multi-layer coating the substrate body is subjected to a dry or wet jet blasting treatment using a granular jet blasting agent, and
   wherein the jet blasting pressure, the jet blasting duration and the jet blasting angle of the jet blasting treatment are so selected that after the jet blasting treatment the α-Al$_2$O$_3$ layer has an inherent stress in the region of 0 to +300 MPas, and the substrate after the jet blasting treatment within a region of 0 to 10 μm from the surface of the substrate body has an inherent stress minimum in the region of −2000 to −400 MPas.

11. A method for production of a cutting insert according to claim 10 wherein the blasting treatment is a dry jet blasting treatment.

12. A method for production of a cutting insert according to claim 10 wherein the jet blasting agent has a lower level of hardness than corundum (α-Al$_2$O$_3$).

13. A cutting insert according to claim 2 wherein the blasting treatment is a dry jet blasting treatment.

14. A cutting insert according to claim 2 wherein the jet blasting agent has a lower level of hardness than corundum (α-Al$_2$O$_3$).

15. A cutting insert according to claim 4 wherein the hard material layer is TiAlCNO arranged directly under the α-Al$_2$O$_3$ layer and has a layer thickness in the region of 0.1 μm to 1 μm.

16. A cutting insert according to claim 4 wherein the hard material layer is TiN or TiCN with a layer thickness in the region of 2 μm to 15 μm.

17. A cutting insert according to claim 16 wherein the layer thickness of the hard material layer of TiN or TiCN is in the region of 3 μm to 10 μm.

18. A cutting insert according to claim 5 wherein the hard material layers arranged over the substrate surface and under the α-Al$_2$O$_3$ layer and comprising TiN, TiCN and/or TiAlCNO have a total layer thickness in the region of 5 μm to 12 μm.

19. A cutting insert according to claim 18 wherein the hard material layers arranged over the substrate surface and under the α-Al$_2$O$_3$ layer and comprising TiN, TiCN and/or TiAlCNO have a total layer thickness in the region of 7 μm to 11 μm.

20. A cutting insert according to claim 7 wherein the inherent stress minimum is at least −600 MPas.

21. A cutting insert according to claim 20 wherein the inherent stress minimum is at least −800 MPas.

22. A cutting insert according to claim 8 wherein the substrate body comprises hard metal containing 4 to 12% by weight of Co.

23. A cutting insert according to claim 8 wherein the substrate body comprises 0.5 to 10% by weight of cubic carbides of Ti, Nb, Ta or combinations thereof.

* * * * *